(12) United States Patent
Kirn

(10) Patent No.: US 7,230,500 B2
(45) Date of Patent: Jun. 12, 2007

(54) SYNCHRONOUS DELAY-LINE AMPLIFICATION TECHNIQUE

(75) Inventor: Larry Kirn, E. Lansing, MI (US)

(73) Assignee: JAM Technologies, Inc., Boston, MA (US)

( * ) Notice: Subject to any disclaimer, the term of this patent is extended or adjusted under 35 U.S.C. 154(b) by 0 days.

(21) Appl. No.: 11/168,810

(22) Filed: Jun. 28, 2005

(65) Prior Publication Data

US 2006/0077011 A1 Apr. 13, 2006

Related U.S. Application Data

(60) Provisional application No. 60/583,507, filed on Jun. 28, 2004.

(51) Int. Cl.
*H03B 1/00* (2006.01)

(52) U.S. Cl. .................. 331/74; 331/57; 323/282; 327/175

(58) Field of Classification Search .................. 331/57, 331/45, 74; 323/282; 327/175
See application file for complete search history.

(56) References Cited

U.S. PATENT DOCUMENTS

| 4,773,096 A | 9/1988 | Kirn ........................... 381/120 |
| 6,535,058 B1 | 3/2003 | Kirn ........................... 330/10 |
| 6,825,644 B2 * | 11/2004 | Kernahan et al. ........... 323/283 |

* cited by examiner

*Primary Examiner*—Arnold Kinkead
(74) *Attorney, Agent, or Firm*—Gifford, Krass, Sprinkle, Anderson & Citkowski, PC

(57) ABSTRACT

An open-loop switching amplifier achieves synchronous operation using a ring oscillator based upon a tapped delay line. A counter is clocked from the ring oscillator, periodically comparing incoming more significant data to the value of the counter to form a pulsewidth modulated output waveform. Modulating the effective width of the output waveform in incremental delay line taps is equivalent to incoming less significant data. This technique then effects time-period summation of coarse and fine resolution clocked data.

2 Claims, 1 Drawing Sheet

SYNCHRONOUS DELAY-LINE AMPLIFICATION TECHNIQUE

REFERENCE TO RELATED APPLICATION

This application claims priority from U.S. Provisional Patent Application Ser. No. 60/583,507, filed Jun. 28, 2004, the entire content of which is incorporated herein by reference.

FIELD OF THE INVENTION

This invention relates generally to switching amplifiers and, in particular, to apparatus and methods enabling an open-loop switching amplifier to achieve synchronous operation.

BACKGROUND OF THE INVENTION

Open-loop switching amplifiers with digital inputs typically operate as clock-synchronous devices which deliver two defined voltage levels to a load. Resultantly, time resolution of the output pulsewidths cannot be finer than that of the driving clock signal. Unlike their analog-input equivalents, the dynamic range of digital-input switching amplifiers is therefore limited by the resolution (or frequency) of the clock. While dynamic range may be extended by the use of more than two defined output switching levels, as taught in U.S. Pat. No. 6,535,058 entitled "Multi-Reference, High-Accuracy Switching Amplifier," additional circuitry and/or output switching devices are incurred.

Dynamic range enhancement through the use of asynchronous delay line elements is taught in U.S. Pat. No. 4,773,096, entitled "Digital Switching Power Amplifier," incorporated herein by reference. However, significant distortion results from the lack of synchronization between clocked and delay line elements of such an amplifier. There exists a need of a simple method whereby an open-loop switching amplifier can avail itself of fully synchronous operation.

SUMMARY OF THE INVENTION

The present invention broadly allows an open-loop switching amplifier to achieve fully synchronous operation. In terms of circuitry, the preferred embodiment includes a ring oscillator based upon a tapped delay line. A counter is clocked from the ring oscillator, periodically comparing incoming more significant data to the value of the counter to form a pulsewidth modulated output waveform. Modulating the effective width of the output waveform in incremental delay line taps is equivalent to incoming less significant data. This technique then effects time-period summation of coarse and fine resolution clocked data, the result being the time equivalent of the voltage/current/power technique disclosed in U.S. Pat. No. 6,535,058 entitled "Multi-Reference, High-Accuracy Switching Amplifier."

DETAILED DESCRIPTION OF THE INVENTION

Figure 1:
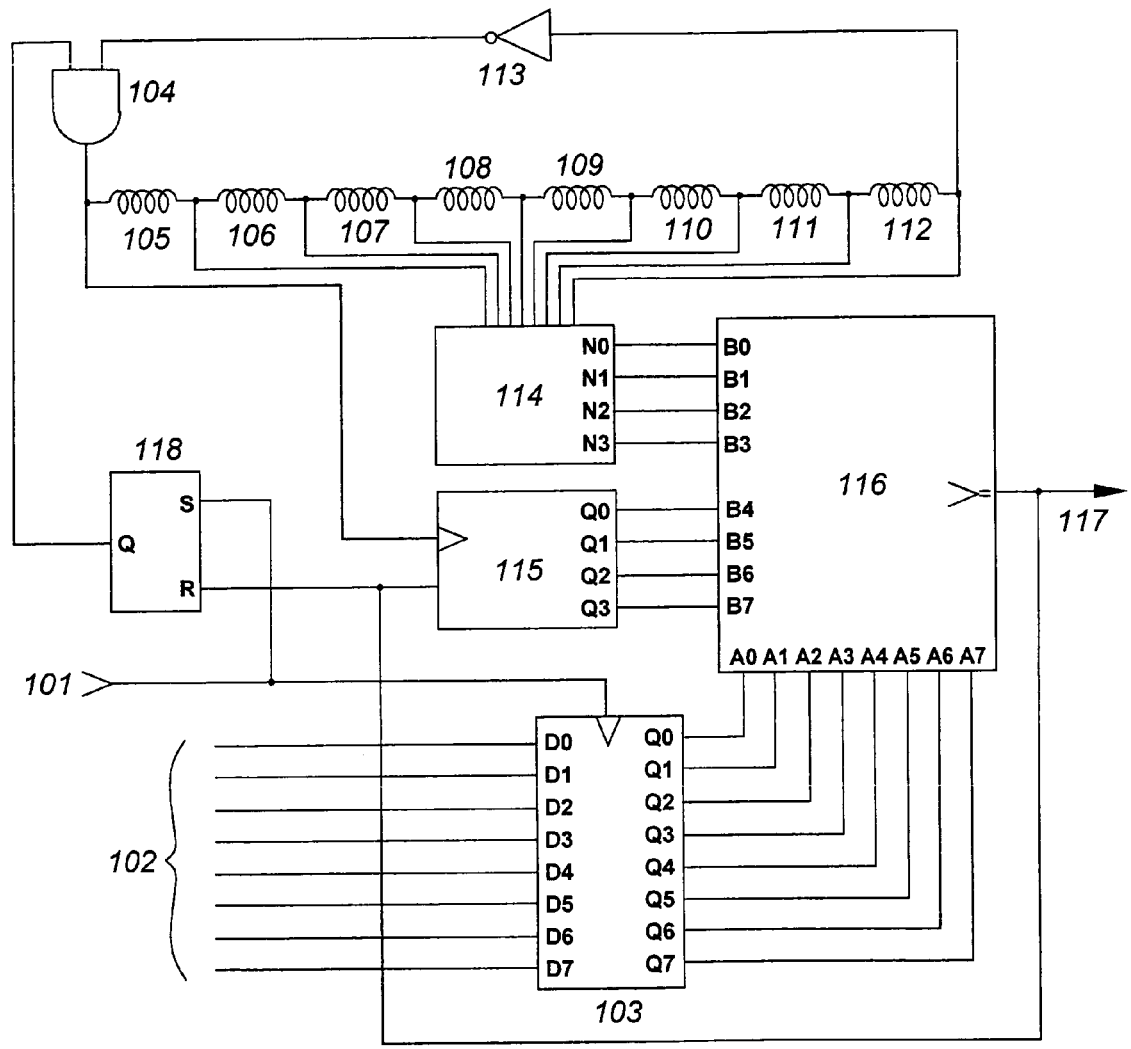
FIG. 1 shows block diagram of an embodiment of the present invention.

Referring now to FIG. 1, delay-elements 105, 106, 107, 108, 109, 110, 111, 112 are connected serially, with the ultimate output connected to the input of inverter 113. The output converter 113 is gated by AND gate 104 to then drive delay element 105 as well as the clock input of counter 115. The delay elements 105 through 112 and inverter 113 therefore comprise a ring oscillator which produces a series of bit patterns to decoder 114, and a clock signal to counter 115.

It can be seen that, in this particular example, eight specific bit patterns will be presented to decoder 114 after each negative-going transition of the clock input of counter 115, and that eight different specific bit patterns will be presented to decoder 114 after each positive-going transition of the clock input of counter 115. Decoder 114 receives the bit patterns from delay elements 105 through 112, and produces a known binary number for each bit pattern at outputs N0, N1, N2, N3. Outputs N0 through N3 of decoder 114 drive less significant inputs B0, B1, B2, B3, respectively, of binary comparator 116. Outputs Q0, Q1, Q2, Q3 of counter 115, which is clocked once per sixteen output states of decoder 114, drive comparator 116 more significant inputs B4, B5, B6, B7, respectively. Inputs B0 through B7 of comparator 116 can then be seen to be driven through sequential binary states, four bits of which are derived from asynchronous delays and four bits of which are derived from a counter synchronized to said delays.

Inputs A0, A1, A2, A3, A4, A5, A6, A7 of comparator 116 receive as input outputs Q0, Q1, Q2, Q3. Q4, Q5, Q6, Q7 of latch 103, which receives incoming data 102 as inputs D0, D1, D2, D3, D4, D5, D6, D7, respectively. Latched incoming data is thus compared with the aforementioned composite sequential binary states to form a pulsewidth modulated signal 117. Pulsewidth signal 117 resets counter 115 and flip-flop 118 directly at their reset inputs. The output of flip-flop 118, when so reset, disables AND gate 104 output.

The ring oscillator described above and counter 115 are thus stopped at the end of each pulsewidth period. At the start of each pulsewidth period, period start strobe 101 both latches new incoming data 102 at the output of latch 103, and enables both the ring oscillator and counter 115 by setting the output of flip-flop 118 high. By this means, pulsewidth period synchronization is effected.

By the above discussion, it can be seen that multiple time references (one faster than that possible with synchronous logic, and one slower) are used to modulate a pulsewidth signal. Use of pulsewidth signal 117 is then used for the purpose of amplification, as is well known in the art.

Although comparison is used to illustrate application of the present invention to pulsewidth modulation, other techniques, such as direct delay production, are as well anticipated.

I claim:

1. Electronic circuitry enabling an open-loop switching amplifier receiving incoming data to achieve synchronous operation, comprising:
    a ring oscillator based upon a tapped delay line;
    a decoder having an input connected to the taps of the delay line and an output forming the more significant data to a comparator;
    a counter clocked by the ring oscillator; and
    wherein the comparator periodically compares the more significant data to the value of the counter to form a pulsewidth modulated output waveform.

2. The circuitry of claim 1, wherein the tapped delay line has 8 taps.

* * * * *